United States Patent
Erdogan et al.

(10) Patent No.: US 8,659,343 B2
(45) Date of Patent: Feb. 25, 2014

(54) CALIBRATION FOR MIXED-SIGNAL INTEGRATOR ARCHITECTURE

(75) Inventors: Ozan E. Erdogan, Sunnyvale, CA (US); Guozhong Shen, San Jose, CA (US); Rajesh Anantharaman, San Jose, CA (US); Ajay Taparia, Santa Clara, CA (US); Behrooz Javid, Irvine, CA (US); Syed T. Mahmud, Dublin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 30 days.

(21) Appl. No.: 13/404,817

(22) Filed: Feb. 24, 2012

(65) Prior Publication Data

US 2012/0218020 A1    Aug. 30, 2012

Related U.S. Application Data

(60) Provisional application No. 61/446,944, filed on Feb. 25, 2011.

(51) Int. Cl.
G06F 7/64    (2006.01)

(52) U.S. Cl.
USPC ........... 327/336; 327/337; 327/339; 327/341; 327/345

(58) Field of Classification Search
USPC ................ 327/336, 337, 339, 341, 345
See application file for complete search history.

(56) References Cited

U.S. PATENT DOCUMENTS

| | | | |
|---|---|---|---|
| 4,567,465 A | 1/1986 | Komiya | 341/168 |
| 4,816,745 A | 3/1989 | Schneider | 324/704 |
| 4,908,623 A * | 3/1990 | Ullestad | 341/167 |
| 4,939,520 A * | 7/1990 | Biglow | 341/167 |
| 4,949,398 A | 8/1990 | Maas | 455/326 |
| 4,999,632 A * | 3/1991 | Parks | 341/167 |
| 5,321,403 A * | 6/1994 | Eng et al. | 341/168 |
| 5,329,316 A | 7/1994 | Kang | 348/625 |
| 5,799,248 A | 8/1998 | Vice | 455/333 |
| 6,043,943 A | 3/2000 | Rezzi et al. | 360/46 |
| 6,285,310 B1 * | 9/2001 | Michaelis et al. | 341/166 |
| 6,433,713 B1 * | 8/2002 | Fuhrman | 341/120 |
| 6,493,404 B1 | 12/2002 | Iuzuka et al. | 375/343 |
| 7,482,870 B2 | 1/2009 | Maejima et al. | 330/207 P |
| 7,898,329 B1 | 3/2011 | Clara et al. | 330/254 |
| 8,031,094 B2 | 10/2011 | Hotelling et al. | 341/143 |
| 8,354,991 B2 | 1/2013 | Brown | 345/101 |
| 2002/0072770 A1 | 6/2002 | Pless | 607/2 |
| 2002/0077670 A1 | 6/2002 | Archer et al. | 607/45 |
| 2003/0184356 A1 | 10/2003 | Wang et al. | 327/258 |
| 2005/0164669 A1 | 7/2005 | Molnar et al. | 455/320 |
| 2005/0275026 A1 | 12/2005 | Tsividis et al. | 257/350 |
| 2006/0141976 A1 | 6/2006 | Rohde et al. | 455/326 |
| 2006/0194560 A1 | 8/2006 | Shu | 455/326 |
| 2007/0257890 A1 | 11/2007 | Hotelling et al. | 345/173 |

(Continued)

*Primary Examiner* — Kenneth B. Wells

(57) ABSTRACT

A mixed signal correlator utilizes coherent detection within a capacitance measurement application. In some applications, the mixed signal correlator is used to measure capacitance of a touch screen display. An external capacitor whose capacitance is measured is kept small for improved sensitivity and can be used for a variety of applications having varied integration periods for measurement. The external capacitor is kept small and can be used for varied applications by adjusting the output voltage within a range that is less than the supply voltage, and maintaining a count of the adjustments to later reconstruct an actual output voltage for the integration period. An output is a weighted sum of an analog integrator output and a digital counter output.

18 Claims, 11 Drawing Sheets

(56) References Cited

U.S. PATENT DOCUMENTS

| | | | |
|---|---|---|---|
| 2008/0157867 A1 | 7/2008 | Krah | 329/304 |
| 2008/0252367 A1 | 10/2008 | Pettersen et al. | 329/311 |
| 2009/0251196 A1 | 10/2009 | Tsividis et al. | 327/355 |
| 2009/0315850 A1 | 12/2009 | Hotelling et al. | 345/173 |
| 2009/0315851 A1 | 12/2009 | Hotelling et al. | 345/173 |
| 2009/0318095 A1 | 12/2009 | Shu | 455/84 |
| 2010/0066473 A1 | 3/2010 | Fahs | 336/30 |
| 2012/0217981 A1 | 8/2012 | Erdogan et al. | 324/679 |
| 2012/0218223 A1 | 8/2012 | Erdogan et al. | |
| 2012/0274404 A1 | 11/2012 | Erdogan et al. | |
| 2013/0069905 A1 | 3/2013 | Krah et al. | 345/174 |
| 2013/0088245 A1 | 4/2013 | Sezginer | 324/679 |
| 2013/0162586 A1 | 6/2013 | Erdogan et al. | 345/174 |

\* cited by examiner

CALIBRATION FOR MIXED-SIGNAL INTEGRATOR ARCHITECTURE

RELATED APPLICATIONS

This application claims priority of U.S. provisional application Ser. No. 61/446,944, filed Feb. 25, 2011, and entitled "Mutual Capacitance Touch-Screen Controller IIC Interface", by these same inventors. This application incorporates U.S. provisional application Ser. No. 61/446,944 in its entirety by reference.

This application is related to U.S. Patent Application Publication No. 2012/0218223 (U.S. Ser. No. 13/404,594 filed on Feb. 24, 2012) and U.S. Patent Application Publication No. 2012/0274404 (U.S. Ser. No. 13/404,722 filed on Feb. 24, 2012), both of which claim the benefit of U.S. Provisional Application No. 61/446,944 filed on Feb. 25, 2011. The disclosure of the above applications are incorporated herein by reference in their entirety.

FIELD OF THE INVENTION

This invention relates to analog front end circuits for converting measured capacitances to voltages. More specifically, this invention relates to analog front end circuits having a mixed-signal correlator or a mixed-signal integrator for demodulating a measured capacitance from an excitation signal.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A resistive touchscreen panel is composed of several layers including two thin metallic electrically conductive and resistive layers separated by thin space. When some object touches the touchscreen panel, the layers are connected at a certain point. In response to the object contact, the panel electrically acts similar to two voltage dividers with connected outputs. This causes a change in the electrical current that is registered as a touch event and sent to the controller for processing.

A capacitive touchscreen panel is coated, partially coated, or patterned with a material that conducts a continuous electrical current across a sensor. The sensor exhibits a precisely controlled field of stored electrons in both the horizontal and vertical axes to achieve capacitance. The human body is conductive and, therefore, influences the capacitance. When a reference capacitance of the sensor is altered by another capacitance field, such as a finger, electronic circuits located at each corner of the panel measure the resultant distortion in the reference capacitance. The measured information related to the touch event is sent to the controller for mathematical processing. Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

FIG. 1 illustrates an exemplary conventional capacitive touch sensor used in a capacitive touchscreen panel. Such sensors are typically formed using transparent conductors, such as ITO (Indium Tin Oxide) conductors, formed in layers. In the exemplary configuration of FIG. 1, bottom conductors form drive electrodes X0, X1, X2, X3, also referred to as drive lines, and top conductors form sense electrodes Y0, Y1, Y2, Y3, also referred to as sense lines. Each cross-point of a drive line and a sense line forms a capacitor having a measured capacitance Cm. The objective is to determine an estimate of a touch position on the capacitive touch sensor. When a finger, or other object that is grounded, is positioned on or proximate a cross-point of the sensor, there is a change in the measured capacitance Cm at that cross-point. The measured capacitance Cm is the capacitance between the sense line and the drive line at the cross-point. When the touch event occurs at the cross-point, a portion of the field lines between the sense line and the drive line are diverted to between the sense line and the finger. As such the measured capacitance Cm decreases during a touch event.

An analog front end (AFE) circuit performs signal processing on an analog signal and typically performs an analog-to-digital conversion. Analog front end circuits can be used in a variety of applications, including measuring and converting a capacitance to a corresponding voltage. FIGS. 2A and 2B illustrate a simplified schematic block diagram of a conventional analog front end circuit used for measuring a capacitance of an external capacitor and converting the measured capacitance to a corresponding voltage. In an exemplary application, the external capacitance is the charge stored in the capacitor Cm of FIG. 1. FIG. 2A illustrates the circuit in a first phase, and FIG. 2B illustrates the circuit in a second phase. During phase 1, charge to be measured is collected on the capacitor Cm. During phase 2, the charge stored on the capacitor Cm is transferred to the capacitor Cf and a corresponding voltage Vout is output.

Referring to FIG. 2A, the circuit includes the capacitor Cm, an operational amplifier 2, a switch 4, a feedback capacitor Cf, and a switch 6. A voltage at the negative input of the amplifier 2, and therefore at a first terminal of the capacitor Cm, is a virtual ground, Vvg. During phase 1, the switch 4 is connected to the reference voltage Vref, and the switch 6 is closed. Closing the switch 6 enables the capacitor Cf to completely discharge to a known zero state. The charge across the capacitor Cm is Vvg−Vref times the capacitance Cm.

During phase 2, the switch 4 is connected to ground, and the switch 6 is opened, as shown in FIG. 2B. With the switch 4 connected to ground the voltage across the capacitor Cm is zero, and all the charge on the capacitor Cm is transferred to the capacitor Cf. The output voltage Vout is a signal with amplitude dependent on the charge stored on the capacitor Cm and transferred to the capacitor Cf. The output voltage Vout can be input to an analog-to-digital converter (ADC), such as in FIG. 4, to be converted to a corresponding digital output value. Since the capacitor Cf was completely discharged during phase 1, the charge stored on capacitor Cf is determined entirely by the amount of charge transferred from the capacitor Cm. If the capacitor Cf is not completely discharged to a zero state during phase 1, then the capacitor Cf will retain the memory of its previous state.

The output voltage Vout=Vref*Cm/Cf+vn, where Vref is a known internal reference value, vn is the undesired noise measured by the system, and Cf is a known value. As such, the capacitance Cm can be determined from the known values Vref and Cf and the measured value Vout. The capacitance Cm is a varying capacitance and represents the capacitance to be measured, such as the measured capacitance of a touch screen display. As a finger touches the touch screen display, the capacitance changes, which is the external capacitance change being measured.

A problem with the circuit of FIGS. 2A and 2B relates to wide-band noise sampling. The circuit does not include any noise filtering, so any noise introduced into the system at the transition from phase 1 to phase 2 is included within the charge transferred to the capacitor Cf. This noise is represented as the component "vn" in the output voltage Vout. So not only is the output voltage Vout a measure of the capacitance Cm, but also an instantaneous sampling of the noise. Further, the dynamic range of the ADC needs to be large enough to account for the increased magnitude of the output voltage Vout due to noise. The larger dynamic range results in an ADC that has a larger area and uses more power.

FIG. 3 illustrates exemplary response curves for the circuit of FIGS. 2A and 2B. The top curve shows a sampling clock corresponding to phase 1 and phase 2. When the sample clock is high, e.g. 1V, the circuit is in phase 1 (FIG. 1), and when the sample clock is low, e.g. 0V, the circuit is in phase 2 (FIG. 2). In an exemplary application, the input is sampled on the rising edge of the sampling clock. The moment that the switches 4 and 6 are changed from phase 2 to phase 1 the voltage Vout is sampled. As shown in the middle curve of FIG. 3, there is some noise on the input signal, but its average value is substantially constant. The sampled value is expected to be constant, such as 1V, but due to the noise the actual sampled output varies about the expected constant value depending on the instantaneous noise present at the sampling time. An example of this variation on the actual sampled output is shown in the bottom curve of FIG. 3. If the instantaneous noise is high, then the actual sampled output is greater than the expected constant value, such as the portions of the sampled output curve that are above 1V. If the instantaneous noise is low, then the actual sampled output is lower than the expected constant value, such as the portions of the sampled output curve that are below 1V.

In application, a threshold voltage for determining a change in capacitance, such as a touch event on a touch screen display, is increased to accommodate the variation in the sampled output. Increasing the threshold voltage reduces the sensitivity of the system. Using a threshold voltage that is too low to account for the noise variations results in false triggers.

Various alternative systems that measure a capacitance include considerations for the noise. FIG. 4 illustrates a simplified schematic block diagram of a conventional analog front end circuit using digital filtering. The circuit of FIG. 4 includes an analog-to-digital converter (ADC) connected to the output of the low-noise amplifier (LNA). Voltage input to the ADC is converted to a digital value, which is processed by digital processing circuitry that includes noise filtering. The ADC is also a sampling system which samples at a single instant in time. This results in similar varying sampled output values as described above in relation to FIG. 3.

FIG. 5 illustrates a simplified schematic block diagram of another conventional analog front end circuit. The circuit of FIG. 5 is the same as the circuit of FIG. 4 with the addition of a band-pass filter (BPF) to filter the signal prior to inputting to the ADC. The BPF attempts to filter the noise present in the voltage signal (middle curve of FIG. 3) prior to inputting to the ADC. Sampling is performed on the filtered signal output from the BPF. The problem with the circuit of FIG. 5 is that different applications are subjected to different noise spectrums. As such, the BPF cannot be fixed, instead the BPF must be tunable to the specific application. Also, the BPF should be able to be finely tuned to accommodate applications with a relatively narrow frequency response. For example, a touch screen display may have a frequency response between about 50-400 kHz. If the BPF has too large a bandwidth, such as 50 kHz, the filter bandwidth may be too wide to effectively filter noise for certain applications.

SUMMARY OF THE INVENTION

A mixed signal correlator utilizes coherent detection within a capacitance measurement application. In some applications, the mixed signal correlator is used to measure an external capacitance, such as that of a touch screen display. The correlator capacitance is kept small for improved sensitivity and can be used for a variety of applications having varied integration periods for measurement. The correlator capacitance is kept small and can be used for varied applications by adjusting the output voltage within a range that is less than the supply voltage, and maintaining a count of the adjustments to later reconstruct an actual output voltage for the integration period. An output is a weighted sum of an analog integrator output and a digital counter output. The actual output voltage is reconstructed using a digitized value used for each voltage adjustment. The voltage adjustment value is a function of the capacitor ratio between an integrating feedback capacitor of the integrator and a dump capacitor of a voltage adjustment circuit. The actual value of the capacitor ratio can be measured using a calibration process.

In an aspect, an integration circuit is disclosed. The integration circuit includes an input control switch, an integrator, a voltage adjustment circuit, and a logic circuit. The input control switch is configured to switch to a first position coupled to an input voltage signal and to a second position coupled to ground. The integrator is coupled to an output of the input control switch, wherein the integrator is configured to output an integrated output voltage. A voltage adjustment circuit is coupled to the integrator, wherein the voltage adjustment circuit is configured to adjust the integrated output voltage by a voltage adjustment. The logic circuit is coupled to the voltage adjustment circuit and to the input control switch. The logic circuit is configured to control the voltage adjustment circuit and the input control switch. When the input control switch is set to the first position, the integrator integrates the input voltage signal and the voltage adjustment circuit adjusts the integrated output voltage by the voltage adjustment if the integrated output voltage reaches one or more defined limits. When the input control switch is set to the second position, the integrator, the voltage adjustment circuit, and the logic circuit are configured to perform a calibration process that measures a value of the adjustment value.

The integration circuit can also include a resistive element coupled to the output of the input control switch; an amplifier coupled to an output of the resistive element; and an integrating feedback capacitor coupled to an input of the amplifier and to an output of the amplifier. The voltage adjustment circuit can include a charge dump capacitor, wherein the value of the voltage adjustment is set by a capacitance ratio of the charge dump capacitor and the integrating feedback capacitor. The voltage adjustment circuit can also include a plurality of switches, wherein the charge dump capacitor is coupled to the integrating feedback capacitor via a first switch of the plurality of switches, and the plurality of switches are coupled to the logic circuit. The integration circuit can also include an analog-to-digital convertor coupled to the output of the integrator to convert the integrated output voltage to a digital value at each integration time period. The logic circuit can be configured to perform the calibration process by measuring the digital value output from the analog-to-digital converter while the input control switch is in the second position, forcing the voltage adjustment circuit to adjust the integrated output voltage by the voltage adjustment while the input control switch is in the second position, and measuring the digital value output from the analog-to-digital converter after the forced voltage adjustment while the switch is in the second position. The voltage adjustment value can be a fixed value Vj. The integration circuit can also include a comparison circuit coupled to the integrator, wherein the comparison circuit is configured to receive the integrated output voltage, to compare the integrated output voltage to the one or more defined limits, and to output a comparison result to the logic circuit. The logic circuit can include program instructions configured to perform the steps of comparing the integrated output voltage to the one or more defined limits, and to control the voltage adjustment circuit according to a comparison result. The resistive element can have a fixed impedance, or the resistive element can have a time-varying impedance.

In another aspect, a method of calibrating an integration circuit is disclosed. The method includes coupling an input of an integrator to ground and discharging an integrating feedback capacitor within the integrator, wherein an output of the integrating feedback capacitor outputs an integrated output voltage according to a current charge accumulated by the integrating feedback capacitor. The method also includes measuring the integrated output voltage to determine a first calibration voltage, and applying a charge dump to the integrating feedback capacitor thereby adjusting the integrated output voltage. The method also includes measuring the integrated output voltage after application of the charge dump to determine a second calibration voltage. The method also includes calculating a difference between the first calibration voltage and the second calibration voltage to determine a measured adjustment voltage value that corresponds to the charge dump. The method also includes discharging the integrating feedback capacitor.

Calculating the difference between the first calibration voltage and the second calibration voltage can include converting the first calibration voltage to a first digital value, converting the second calibration voltage to a second digital value, and calculating a difference between the first digital value and the second digital value. The method can also include coupling the input of the integrator to receive an input voltage signal; comparing the integrated output voltage to one or more threshold values to determine if the integrated output voltage is within a voltage range; adjusting the charge on the integrating feedback capacitor by applying the charge dump if the integrated output voltage is not within the voltage range, thereby maintaining the integrated output voltage within a voltage range; determining an accumulated voltage change corresponding to a number of adjustments in charge applied within an integrating period multiplied by the measured adjustment voltage value; and determining a total integration voltage over the integrating period by adding the accumulated voltage change to the integrated output voltage at the end of the integrating period.

Adjusting the charge can include decreasing the charge on the capacitor if the integrated output voltage is greater than or equal to a high threshold value, and increasing the charge on the capacitor if the integrated output voltage is less than or equal to a low threshold voltage, wherein decreasing the charge on the capacitor decreases the integrated output voltage and increasing the charge on the capacitor increases the integrated output voltage. Comparing the integrated output voltage to one or more threshold values can be performed in software or performed using one or more comparators. Adjusting the charge on the capacitor can result in adjusting the instantaneous integrated output voltage. Determining the total integration voltage can include converting the integrated output voltage to a digital value at each integration time period and adding the accumulated voltage change to the digital value. The measured adjustment voltage value can include a fixed value.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a mixed signal correlator. Those of ordinary skill in the art will realize that the following detailed description of the mixed signal correlator is illustrative only and is not intended to be in any way limiting. Other embodiments of the mixed signal correlator will readily suggest themselves to such skilled persons having the benefit of this disclosure.

Reference will now be made in detail to implementations of the mixed signal correlator as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 6:
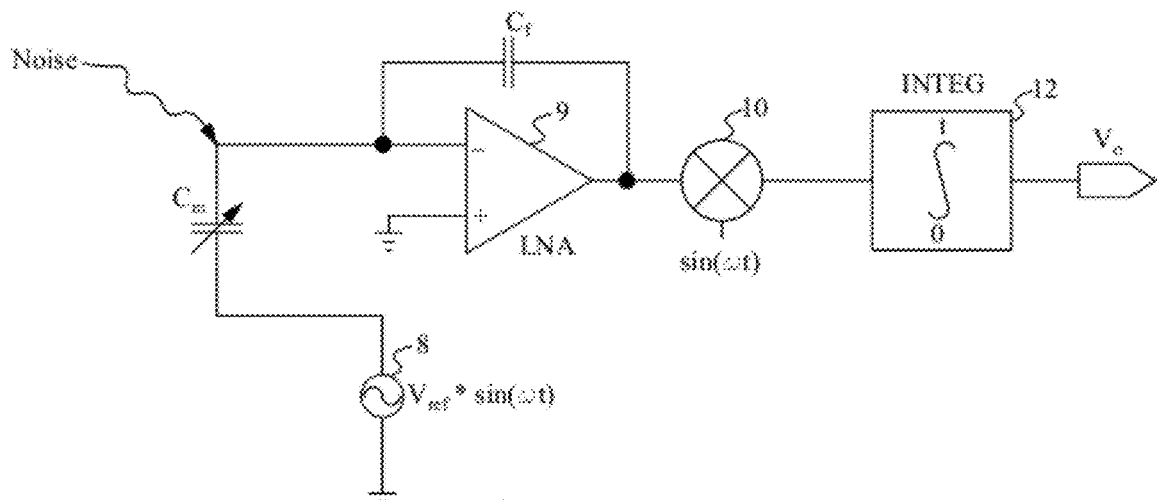
FIG. 6 illustrates a simplified schematic block diagram of an analog front end circuit using coherent detection according to a first embodiment.

In some embodiments, a capacitance measurement is performed by an analog front end circuit that uses coherent detection, also referred to as synchronous demodulation or correlation, to reject noise and/or other interferers. FIG. 6 illustrates a simplified schematic block diagram of an analog front end circuit using coherent detection according to a first embodiment. Coherent detection generally refers to transmitting a signal at a certain frequency f, and detecting the signal at that same frequency f. Signals at other frequencies are considered noise. A mixer 10 and an integrator 12 are together referred to as a correlator, which performs synchronous demodulation, or correlation, to reject noise and/or interferers. In some embodiments, a mixer includes an operational amplifier and a resistor pair including a variable resistor, where an output voltage of the mixer is a function of the input voltage multiplied by the ratio of the two resistors. In some embodiments, an integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Alternatively, other conventional mixer and integrator configurations can be used.

A signal generator 8 generates an excitation signal $\sin(\omega t)$, where $\omega = 2\pi f$. The excitation signal $\sin(\omega t)$ is multiplied by a reference voltage Vref. The resulting signal $V_{ref}*\sin(\omega t)$ is modulated according to a measured capacitance of the capacitor Cm. This modulated signal is amplified by a low-noise amplifier 9, input to the mixer 10 and mixed with the original excitation signal $\sin(\omega t)$. The mixer 10 multiples the two input signals, the modulated and amplified excitation signal and the excitation signal. The multiplied signals are then integrated over a time period T by the integrator 12. The time period T is a multiple of the period 1/f. Multiplying the two sine wave signals results in a DC voltage term (Cm/2Cf) Vref plus a sine term at twice the frequency, which when integrated over a multiple of the frequency cancels out, leaving only the DC voltage term. This is the result when only an ideal signal is present. When noise is introduced, the noise is also multiplied by the excitation signal $\sin(\omega t)$ and integrated. The output voltage Vout can be represented as follows:

$$V_{out} = \frac{C_m}{2C_f} V_{ref} + \int_0^T n(t)\sin(2\pi f t)\,dt \qquad (1)$$

where T is a multiple of 1/f and the noise is represented as n(t). The integrator 12 provides a band-pass filtering function with a peak around f so that the noise, included in the second term in equation (1), is filtered out. The output voltage Vout is the DC voltage term that can be subsequently sampled using an ADC. There is no dynamic signal to be sampled.

Figure 7:
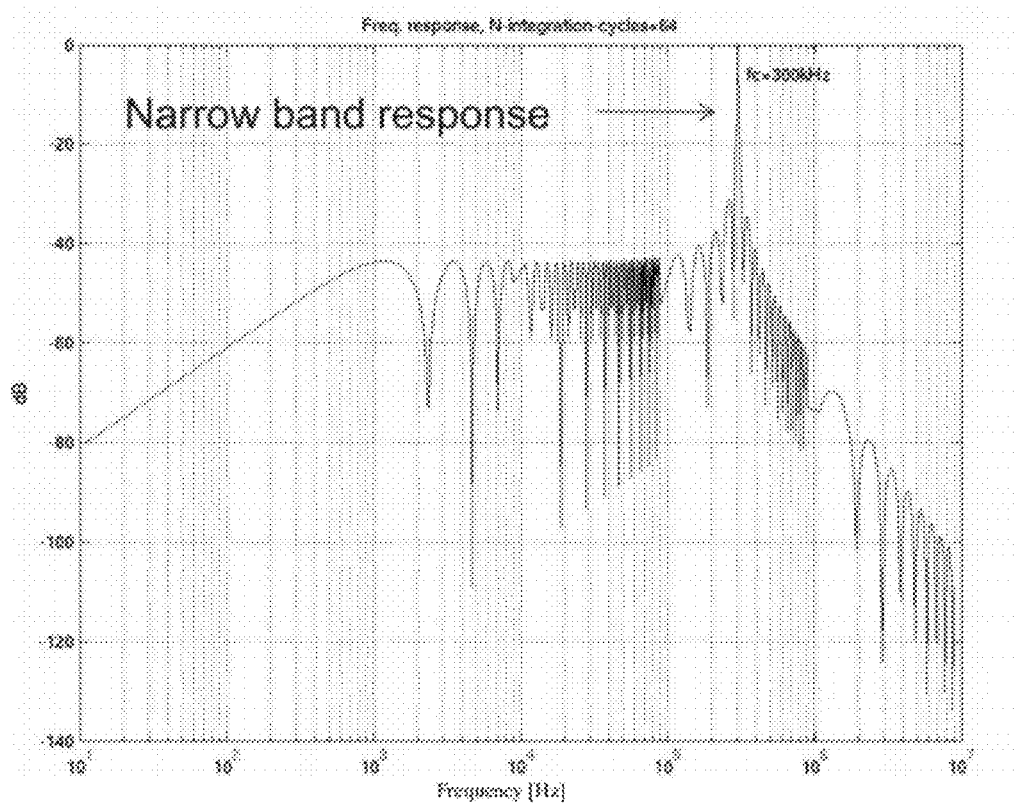
FIG. 7 illustrates an exemplary frequency response of the circuit of FIG. 6 for an excitation frequency f equal to 300 kHz.

FIG. 7 illustrates an exemplary frequency response of the circuit of FIG. 6 for an excitation frequency f equal to 300 kHz. In an exemplary application, the circuit of FIG. 6 is configured for narrow band pass filtering, and the corresponding narrow band frequency response of FIG. 7 shows that the circuit is very selective about 300 kHz. Other frequencies are filtered out.

In addition to filtering out the noise, the coherent detection circuit shown in FIG. 6 can also be easily adapted to generate excitation signals of alternate frequencies so as change the band-pass function. This tuning does not require changing the LNA, the mixer 10, or the integrator 12. The signal generator 8 is simply changed to generate the excitation signal at the alternate frequency. In contrast, the BPF component in the conventional analog front end circuit in FIG. 5, e.g. the resistors and capacitors within the BPF, need to be adjusted to change the band-pass function.

Although the above application is described above in terms of sine waves, it is understood that other waveforms can be used to apply coherent detection. Equation (1) can be generalized to:

$$V_0 = \int_0^T E(t)C(t)dt + \int_0^T n(t)C(t)dt \qquad (2)$$

where E(t) is an excitation signal supplied to the capacitor Cm and C(t) is a correlation signal input to the mixer. E(t) and C(t) can be any waveform such that E(t) and C(t) are correlated. E(t) and C(t) are chosen such that the integration of E(t)C(t) is maximized and the integration of n(t)C(t) is minimized. C(t) is selected for least correlation to noise. The time period T is a multiple of the E(t)*C(t) period.

Implementation of the mixer 10 is a non-trivial task. The mixer 10 is configured to multiply two input analog signals, the modulated and amplified excitation signal and the excitation signal. In some applications, this multiplication function is to be linear. To achieve a linear transfer function, the mixer 10 uses a 10-12 bit linear multiplier. Such a mixer is difficult to build and is expensive.

Figure 8:
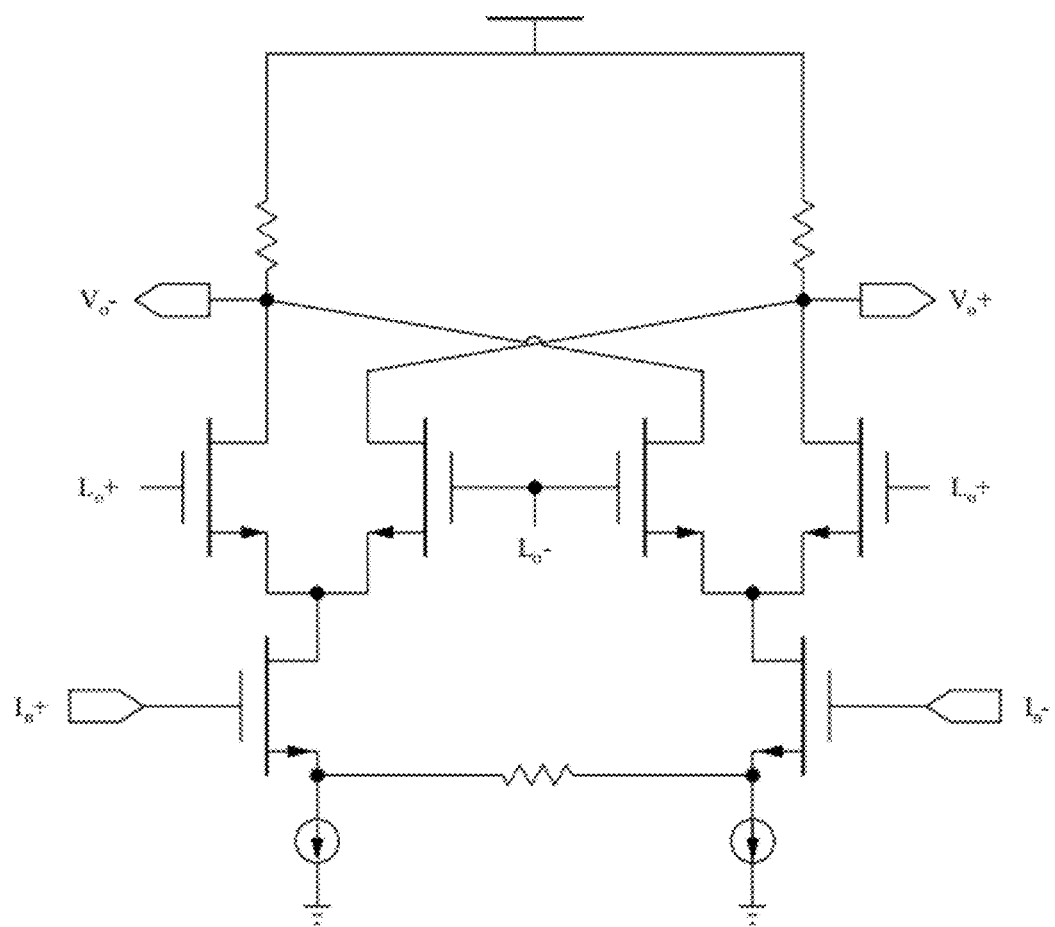
FIG. 8 illustrates a schematic circuit diagram of an exemplary mixing circuit according to an embodiment.

FIG. 8 illustrates a schematic circuit diagram of an exemplary mixing circuit according to an embodiment. The mixing circuit includes two input ports, an In port and an LO port. The In port receives the modulated signal output from the amplifier 9 (FIG. 6). The LO port receives the original excitation signal $\sin(\omega t)$. Plus and minus ports represent a differential signal, as is well known in the art. The In port can be made linear, but the LO port is simply a 5 switch that provides a square wave response. This provides limited rejection of undesired signals at the harmonics of the desired frequency. For example, the 3rd harmonic of a square wave is only 8 dB below the fundamental; therefore, interference at 3*f would only see 8 dB attenuation.

In an alternative configuration, the function of the mixer and the integrator are combined and simplified so as to reduce the complexity associated with performing linear multiplication. Using a simplified description, a mixer can include an operational amplifier and a resistor pair including a variable resistor, where an output voltage of the mixer is a function of the input voltage multiplied by the ratio of the two resistors. An integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Notice is taken of the quantity 1/R in the aforementioned relationship between the input voltage and the output voltage of the integrator. Since a multiplying function is needed to mix the modulated excitation signal and the excitation signal, such as the function performed by the mixer 10 in FIG. 6, if the quantity 1/R can be appropriately modulated, the resistive element can be used to perform the multiplying function. A programmable resistive element can be used to perform this function. Instead of discrete mixing and integrator circuits, the two functions are combined as a single integrated circuit that includes a single operational amplifier, a capacitor, and a programmable resistive element.

Figure 9:
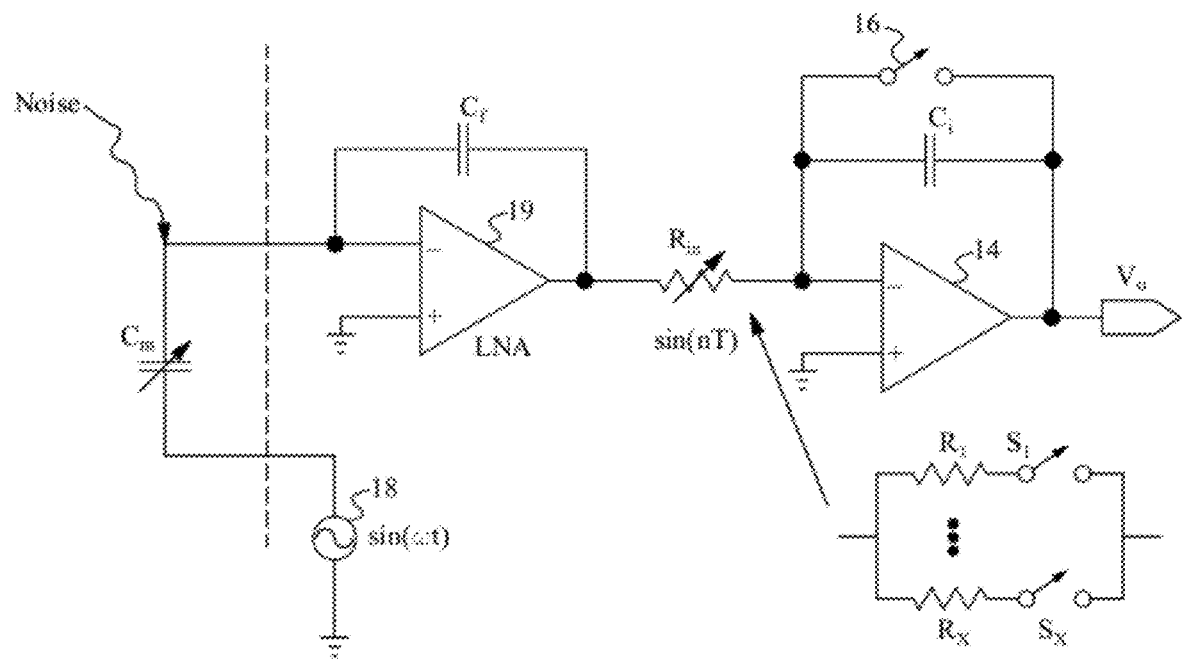
FIG. 9 illustrates a simplified schematic block diagram of an analog front end circuit using coherent detection according to a second embodiment.

FIG. 9 illustrates a simplified schematic block diagram of an analog front end circuit using coherent detection according to a second embodiment. A programmable resistive element Rin, an amplifier 14, and an integrating feedback capacitor Ci form an integrated circuit having the combined functionality of a mixer and an integrator. The programmable resistive element is represented in FIG. 9 as Rin with an arrow. In some embodiments, the programmable resistive element Rin is implemented as a digital array of resistors, shown in the expanded area in FIG. 9 as an array of resistors R1-Rx. Each resistor R1-Rx in the array is coupled to a corresponding on-off switch S1-Sx. One or more of the resistors R1-Rx in the array can be turned on such that the overall conductance of the programmable resistive element Rin imitates a desired waveform, such as a sine wave. In this manner, an appropriate combination of resistors in the array of resistors R1-Rx can be turned on to represent the multiplication of the modulated excitation signal and the excitation signal, thereby performing the multiplication function previously performed by the mixer 10 in FIG. 6.

The switches S1-Sx are controlled by a digitized waveform, such as a digitized sine wave. The conductance G(t) of the programmable resistive element Rin is equal to 1/R(t), which is proportional to the sine wave, where R(t) is the overall resistance of all turned on resistors in the array of resistors R1-Rx. The signal to be digitized is a correlation signal, which is correlated to the excitation signal generated by the signal generator 18. In an exemplary application, the sine wave $\sin(\omega t)$ is digitized. The resulting digital word is used to control the digital switches S1-Sx. This results in a conductance of the programmable resistor Rin that has the characteristic of a sine wave, represented as a digitized sine wave sin(nT), shown in FIG. 7, where "nT" indicates the sine wave is quantized, both in value and in time. The digitized sine wave sin(nT) is a summation of the piece-wise components of the programmable resistor array over the integration time period T. The time period T is a multiple of the period 1/f. The digitized sine wave sin(nT) can be stored in memory and subsequently retrieved for application to the digital switches S1-Sx.

The modulated excitation signal input to the programmable resistive element Rin is also shaped like a sine wave, and as such the result at the output of the programmable resistive element Rin is a multiplied value, which is then integrated according to the operational amplifier 14 and the integrating feedback capacitor Ci. The voltage Vout output from the integration is provided as input to an ADC (not shown) and subsequently processed. The ADC samples the voltage Vout every period of time, for example every 10 microseconds. After the voltage Vout is sampled, the integrating feedback capacitor Ci is discharged by closing the switch 16. After discharge, the switch 16 is opened for the next cycle defined by the integrating time period T.

The analog front end circuits of FIGS. 6 and 9 utilize coherent detection within a capacitance measurement application. In an exemplary application, the analog front end circuit uses coherent detection to measure capacitance of a touch screen display. The analog front end circuit provides excellent noise and interference immunity, and also provides a higher signal to noise ratio.

The analog front end circuit of FIG. 9 combines the functionality of a conventional mixer and integrator by using a programmable resistive element. This combined circuitry performs the multiplication function using a digitized waveform instead of an analog waveform. The digitized waveform is much easier to generate than the analog waveform. Additionally, the combined functionality is performed using a single operational amplifier, as opposed to using a discrete mixer having a first operational amplifier and a discrete integrator having a second operational amplifier.

The analog front end circuits of FIGS. 6 and 9 provide a continuous time signal path, there is no discrete sampling function performed where sampling is performed and then the charge across the capacitor is discharged. The signal continuously flows through the mixer and the integrator of FIG. 6, or through the programmable resistive element and the integrating capacitor of FIG. 9, and because of this there is no aliasing due to time instant sampling. Anti-aliasing is done within the correlator. There is no need for a separate anti-aliasing filter.

The analog front end circuit of FIG. 9 has good linearity because the resistors in the programmable resistive element Rin and the integrating feedback capacitor Ci are very linear.

Figure 1:
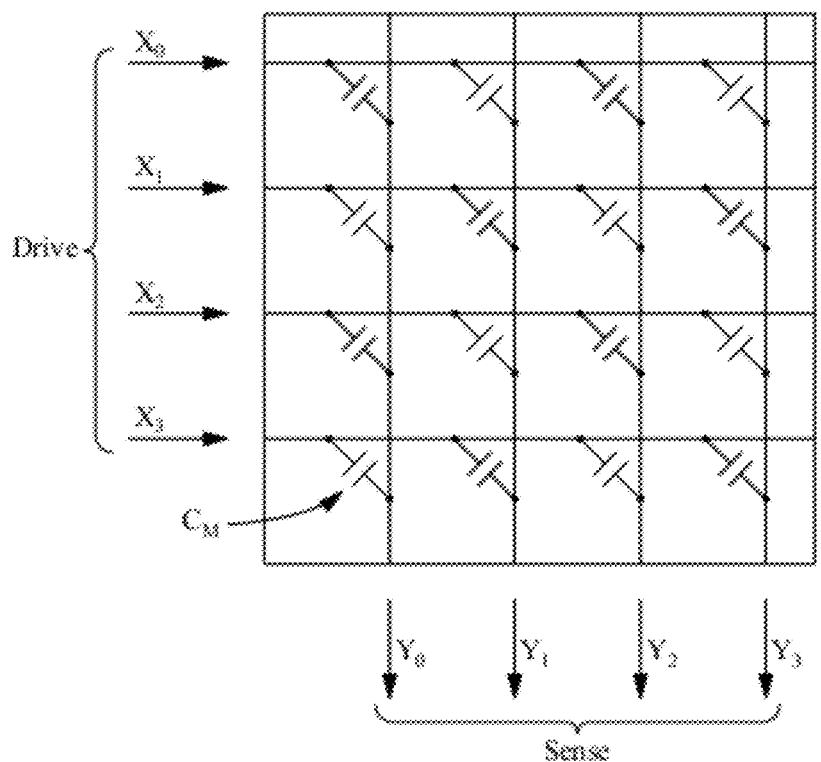
FIG. 1 illustrates an exemplary conventional capacitive touch sensor used in a capacitive touchscreen panel.
Figure 2A:
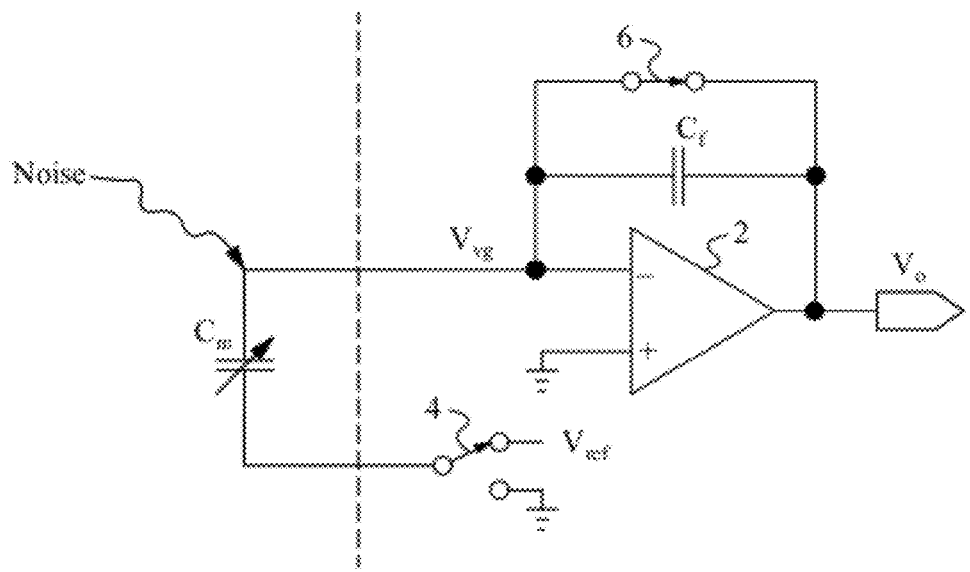
FIGS. 2A and 2B illustrate a simplified schematic block diagram of a conventional analog front end circuit used for measuring a capacitance of an external capacitor and converting the measured capacitance to a corresponding voltage.
Figure 2B:
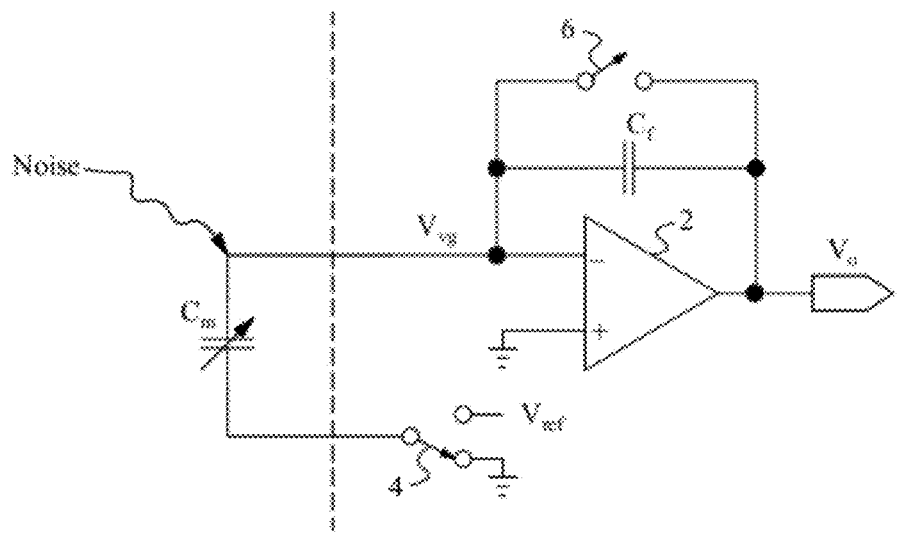
Figure 3:
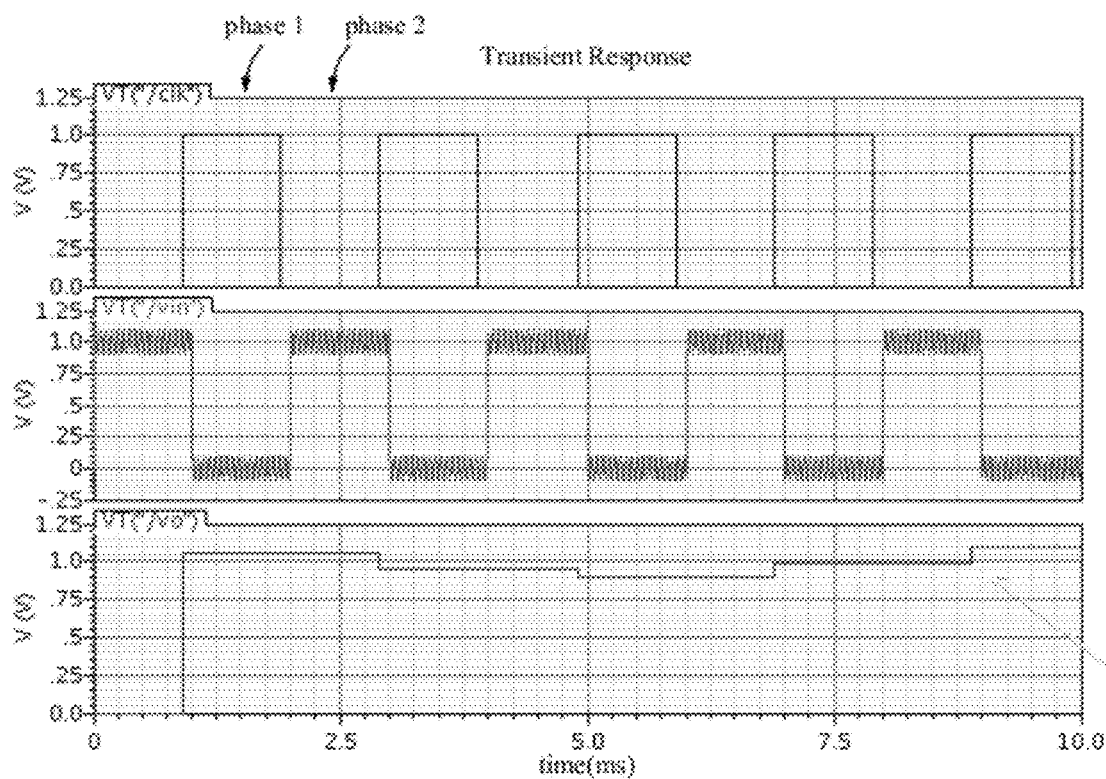
FIG. 3 illustrates exemplary response curves for the circuit of FIGS. 2A and 2B.
Figure 4:
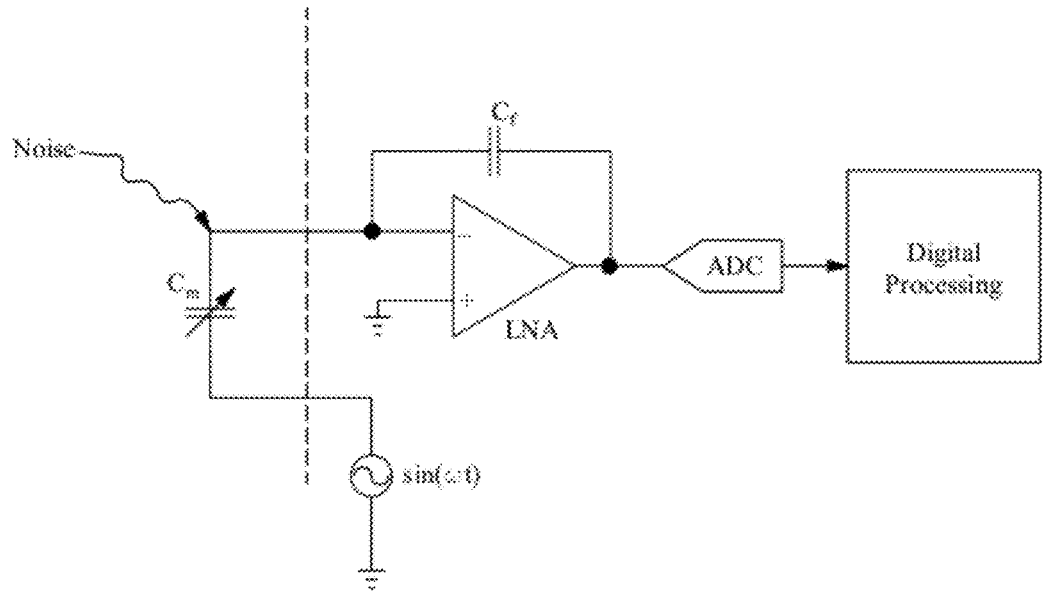
FIG. 4 illustrates a simplified schematic block diagram of a conventional analog front end circuit using digital filtering.
Figure 5:
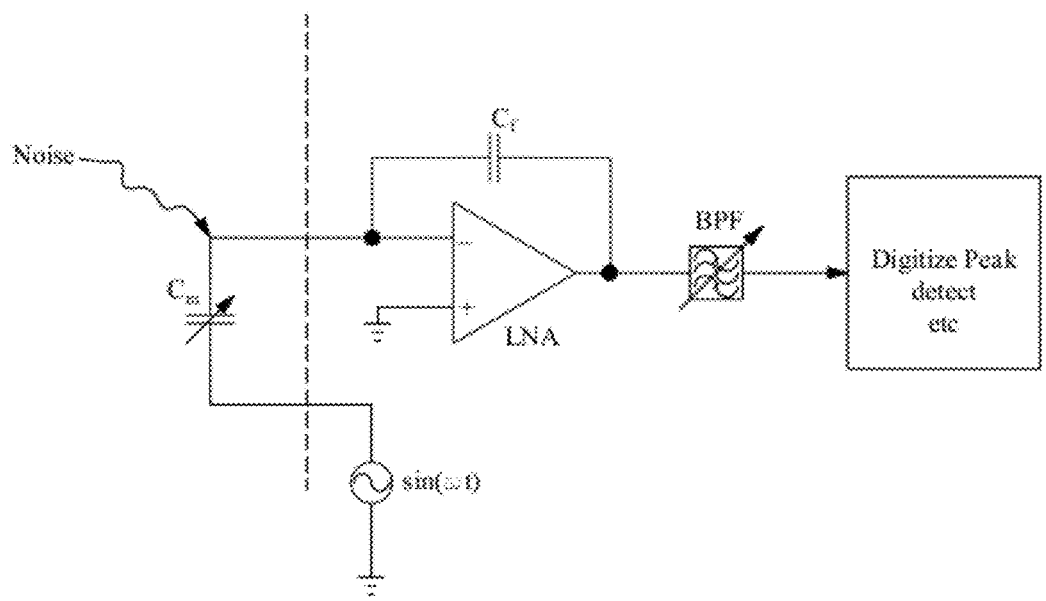
FIG. 5 illustrates a simplified schematic block diagram of another conventional analog front end circuit.

The analog front end circuits of FIGS. 6 and 9 use less power than the conventional analog front end circuits, such as the analog front end circuits of FIGS. 4 and 5. An ADC coupled to the analog front end circuits of FIGS. 6 and 9 does not require as much power as an ADC, such as the ADC used in FIG. 4, that is sampling an active analog signal. The ADC coupled to the analog front end circuits of FIGS. 6 and 9 can be slower and less precise. Also, performing the multiplication function using the programmable resistive element, as in FIG. 9, uses less power and has a smaller area than using a discrete mixing circuit, as in FIG. 6.

The analog front end circuits are described above as being applied to a touch screen application. Alternative applications are also contemplated.

The integrated mixer and integrator is shown in FIG. 9 as including a programmable resistor array coupled to an amplifier and feedback capacitor. This concept can be generalized to use a time-varying impedance element that changes in response to an input control. The time-varying impedance element is coupled to the amplifier and feedback capacitor.

Figure 10:
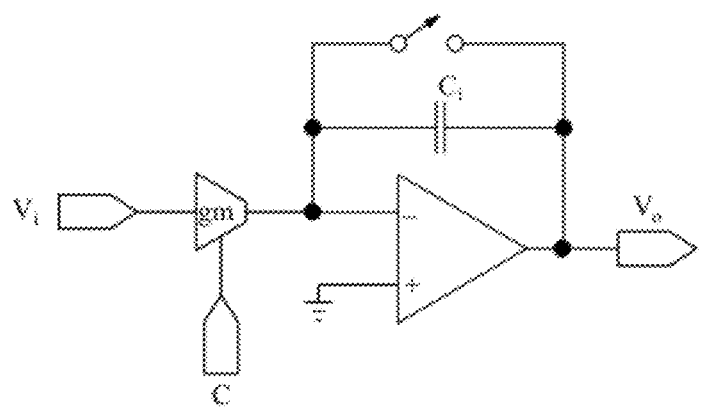
FIG. 10 illustrates a schematic diagram of an integrated mixing and integrating circuit including a transconductor as the time-varying impedance element according to an embodiment.

FIG. 10 illustrates a schematic diagram of an integrated mixing and integrating circuit including a transconductor as the time-varying impedance element according to an embodiment. The transconductor has a programmable transconductance gm that is controlled using digital or analog control C. The transconductance gm can be changed over time to achieve a multiplication operation.

Figure 11:
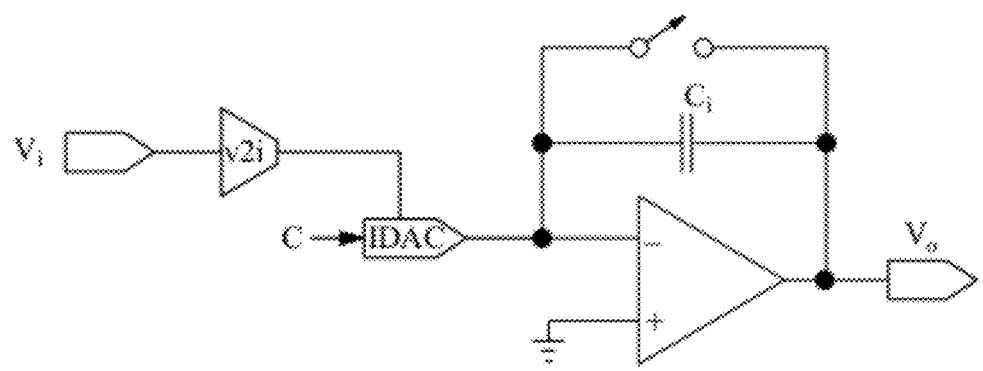
FIG. 11 illustrates a schematic diagram of an integrated mixing and integrating circuit including a current digital to analog converter (IDAC) as the time-varying impedance element according to an embodiment.

FIG. 11 illustrates a schematic diagram of an integrated mixing and integrating circuit including a voltage to current converter v2i and a current digital to analog converter (IDAC) as the time-varying impedance element according to an embodiment. The voltage to current converter v2i converts an input voltage to a corresponding current, which is supplied to the IDAC. The IDAC has a programmable gain that is controlled using digital or analog control C. The effective impedance can be changed over time to achieve a multiplication operation.

Figure 12:
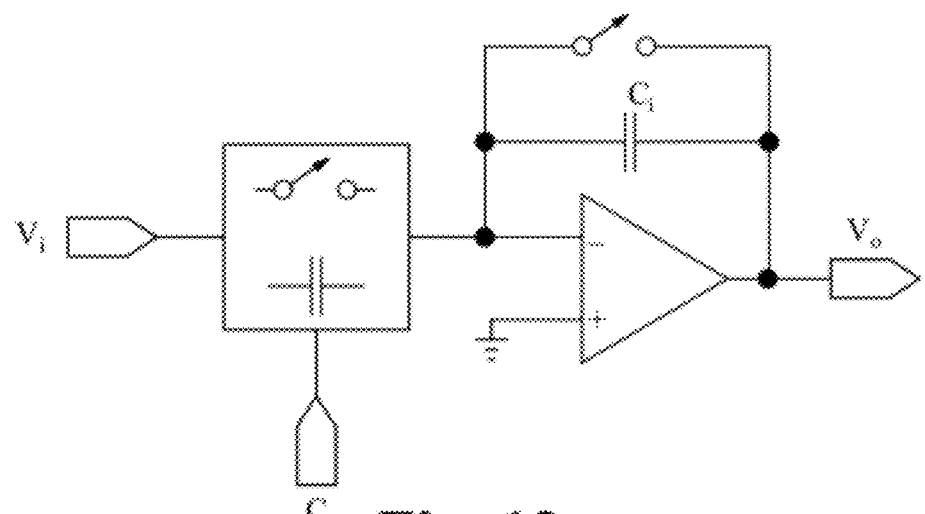
FIG. 12 illustrates a schematic diagram of an integrated mixing and integrating circuit including a programmable capacitive element as the time-varying impedance element according to an embodiment.

FIG. 12 illustrates a schematic diagram of an integrated mixing and integrating circuit including a programmable capacitive element as the time-varying impedance element according to an embodiment. The programmable capacitive element functions similarly as the programmable resistive element of FIG. 9 except for the use of capacitors instead of resistors. The capacitors in the programmable capacitive element are turned on or off to achieve a desired time-varying gain, which functions as the multiplication operation in the integrated mixing and integration circuit.

The integrated mixing and integrating circuits shown in FIGS. 9-12 can be used in applications alternative to touch screens including, but not limited to, radio frequency and thermal applications.

The programmable resistive element Rin, the switch 16, the amplifier 14, and the integrating feedback capacitor Ci in FIG. 9 are collectively referred to as a correlator. The integrating feedback capacitor Ci is a fixed capacitor. The programmable resistive element Rin is time-varying and represented as R(t). The relationship of the output voltage Vout to the input voltage Vin is:

$$Vout = \frac{1}{C} \int_0^T \frac{Vin(t)}{R(t)} dt \qquad (3)$$

where C represents the capacitance of the integrating feedback capacitor Ci. Equation (3) can be rewritten as:

$$Vout = \frac{1}{C} \int_0^T G(t) Vin(t) dt \qquad (4)$$

where G(t) is the conductance of the programmable resistive element, G(t)=1/R(t).

Figure 13:
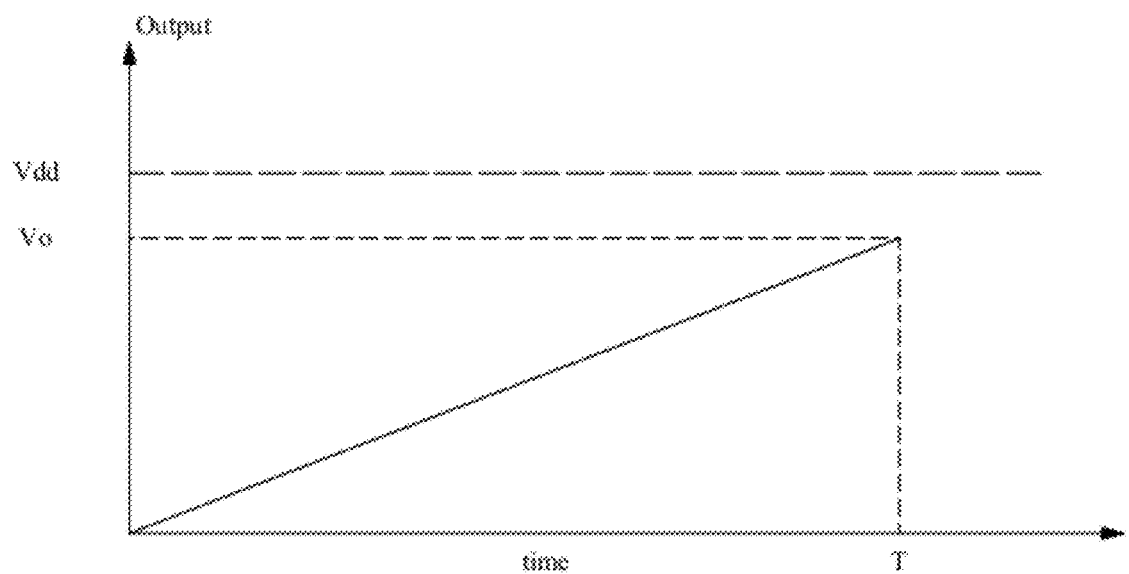
FIG. 13 illustrates an output voltage Vout versus time curve for the correlator of FIG. 9, under the simplified conditions where the resistance R(t) and the input voltage V(t) are constant.

FIG. 13 illustrates an output voltage Vout versus time curve for the correlator of FIG. 9, under the simplified conditions where the resistance R(t) and the input voltage V(t) are constant. The result is a linear function due to integration of a constant value in equation (4). As the positive input of the amplifier 14 (FIG. 9) is referenced to ground, the output voltage Vout is reset to 0V when the integrating feedback capacitor Ci is discharged, which corresponds to a new integration period starting at t=0. The longer the time period, the greater the output voltage Vout. In implementation, the output voltage Vout is limited to the system supply voltage Vdd supplied to the amplifier 14. As such, once the output voltage Vout reaches the supply voltage Vdd, the output voltage Vout no longer increases with time, but instead remains constant at the supply voltage level. The ramification is that if the application requires a larger time period t than the time for the output voltage to reach the supply voltage Vdd, the correlator of FIG. 9 is ineffective for the given value of the integrating feedback capacitor Ci. However, the slope of the output voltage Vout versus time curve is inversely related to the capacitance Ci. If the capacitance Ci is increased, then the slope of the curve is reduced, which means it takes a longer period of time for the output voltage to reach the supply voltage limit. Therefore, implementation of a larger capacitor enables the implementation of a longer time period for integration. However, a larger capacitor has a greater physical area. A larger capacitor also results in reduced sensitivity, since over the same integrating time period, a larger capacitor results in a lower integrated output voltage level than a smaller capacitor. In general, depending on the application and the corresponding integrating time period, the size of the integrating feedback capacitor Ci is optimized to result in the largest possible output voltage Vout. If the integration time period is shorter, then the size of the capacitor is smaller. If the integration time period is longer, then the size of the capacitor is larger. Having a fixed capacitance does not provide flexibility for varying applications.

In an exemplary touch screen display application, the frequency response is relatively slow, for example hundreds of kHz, and therefore the integration time period is relatively long and the RC product is relatively large. A large RC results in large physical area and uses a large amount of power to operate.

To address these limitations associated with a correlator having a fixed capacitance, the correlator of FIG. 9 can be adapted to include a charge adjustment circuit. The correlator and charge adjustment circuit are collectively referred to as a mixed signal correlator. As described above, the correlator of FIG. 9 has both mixing and integrating functionality. In some embodiments, the correlator is configured as a simple integrator. As a simple integrator, a fixed impedance element, such as a resistor, can be used instead of a time-varying impedance element, such as the programmable resistive element. Although a mixed signal correlator is subsequently described, it is understood that the concepts can be applied to an integrator.

Figure 14:
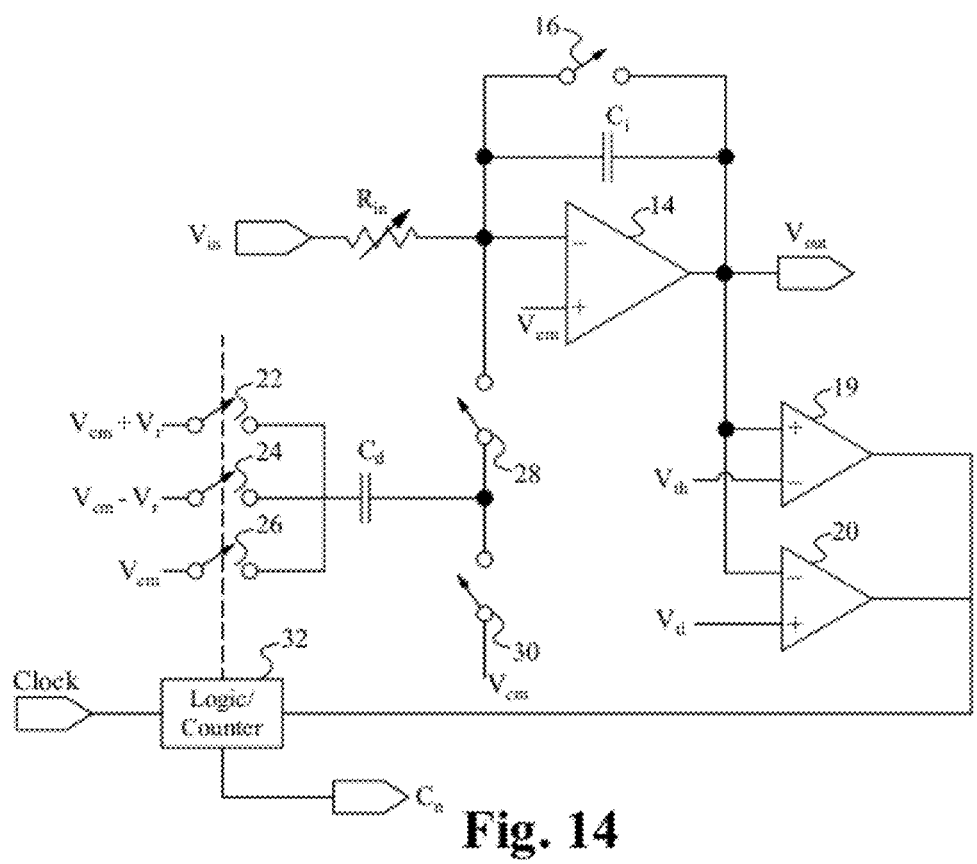
FIG. 14 illustrates a simplified schematic block diagram of a mixed signal correlator according to an embodiment.

FIG. 14 illustrates a simplified schematic block diagram of a mixed signal correlator according to an embodiment. The mixed signal correlator includes the correlator of FIG. 9, including the amplifier 14, the integrating feedback capacitor Ci, and the programmable resistive element Rin. The positive input of the amplifier 14 in FIG. 14 is coupled to a known voltage Vcm, such as one-half the supply voltage Vdd. The mixed signal correlator also includes two comparators 19 and 20, switches 22, 24, 26, 28, and 30, a charge dump capacitor Cd, and a logic/counter 32.

Figure 15:
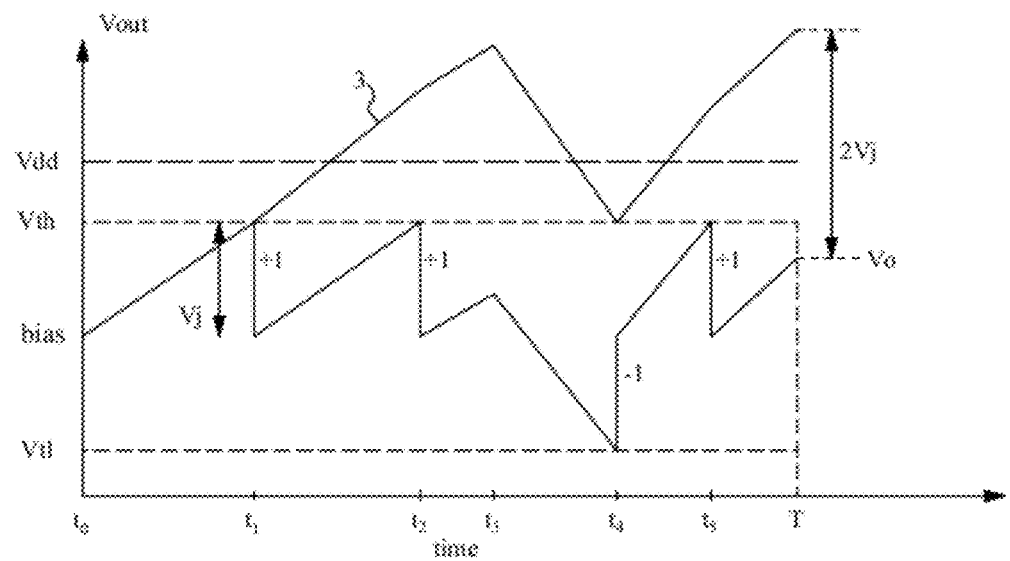
FIG. 15 illustrates an exemplary timing diagram corresponding to operation of the mixed signal correlator of FIG. 14.

FIG. 15 illustrates an exemplary timing diagram corresponding to operation of the mixed signal correlator of FIG. 14. The timing diagram shows the output voltage Vout versus time. The switches 22-30 are all shown to be open in FIG. 14, this is merely for illustration. During the course of operating the mixed signal correlator, various combinations of the switches are turned on an off, as will be described in connection with the timing diagram below.

After each integration period, the switch 16 is closed and the integrating feedback capacitor Ci is discharged. The switch 16 is then opened for the duration of the next integration period.

The timing diagram shows an integration period starting point at t=0. The output voltage Vout at the start of an integration period is equal to voltage Vcm supplied at the positive terminal of the amplifier 14, which in this case is one-half the supply voltage Vdd. The comparator 19 compares the instantaneous output voltage Vout to a threshold high voltage Vth, and the comparator 20 compares the instantaneous output voltage Vout to a threshold low voltage Vtl. As time increases from t=0, the output voltage Vout rises until it reaches the threshold high voltage level Vth at time t1. When the output voltage Vout equals or exceeds the threshold high voltage Vth, the comparator 19 signals the logic/counter 32 to perform a charge dump, or voltage adjustment, operation so that the output voltage Vout is reduced and remains within the supply voltage range. The threshold high voltage Vth is set to a value less than the supply voltage Vdd, and the threshold low voltage Vtl is set to a value greater than zero.

The logic/counter 32 controls the switches 22-30. While the output voltage Vout is within the threshold high and low voltage range, Vth and Vtl respectively, the switches 26 and 30 are closed and the switches 22, 24, and 28 are open so that the charge dump capacitor Cd is discharged. When the comparator 19 signals that the output voltage Vout equals or exceeds the threshold high voltage Vth, such as at time t1, the switches 30 and 26 are opened, the switch 24 stays open, then switches 22 and 28 are closed. The dump capacitor charges to reference voltage Vr and the charge Vr*Cd is dumped to the negative terminal of the operational amplifier 14, which causes a negative voltage adjustment −Vj in the output voltage Vout. The amount of voltage drop −Vj is determined according to the reference voltage Vr and the capacitances of the charge dump capacitor Cd and the integrating feedback capacitor Ci. Specifically, voltage drop −Vj=Vr(Cd/Ci). In the exemplary application shown in the timing diagram of FIG. 15, the voltage adjustment Vj is equal to one-half the difference between the threshold high voltage Vth and the threshold low voltage Vtl, thereby dropping the output voltage Vout to the midway point between the two threshold voltages. The timing diagram shows application of the voltage adjustments, such as at time t1, as an instantaneous response when reaching the threshold voltage. This is merely for illustrative purposes. In practice, there is a delay corresponding to charging the dump capacitor Cd.

After the output voltage adjustment at time t1, the switches 22 and 28 are opened, the switch 24 remains open, and the switches 26 and 30 are closed so that the charge dump capacitor Cd discharges. As time increases, t>t1, the output voltage Vout increases until it again reaches the threshold high voltage Vth at time t2 and the output voltage downward adjustment, −Vj, is again triggered and initiated.

The secondary curve 3 in the timing diagram reflects the output voltage Vout if the circuit were configured without the voltage adjustments, as in the correlator of FIG. 9, and the circuit were not limited by the supply voltage Vdd. In practice, the output voltage Vout would not be able to exceed the supply voltage Vdd.

After the second output voltage adjustment at time t2, the switches 22 and 28 are opened, the switch 24 remains open, and the switches 26 and 30 are closed so that the charge dump capacitor Cd discharges. As time increases, t>t2, the output voltage Vout increases. However, in this case the output voltage Vout eventually begins to decrease in value without reaching the triggering threshold high voltage Vth. The drop in output voltage Vout is due to a change in sign of the input voltage Vin, such as at time t3. As time increases, t>t3, the output voltage Vout continues to decrease until it reaches the threshold low voltage level Vtl at time t4. When the output voltage Vout equals or is less than the threshold low voltage Vtl, the comparator 20 signals the logic/counter 32 to perform a charge dump operation so that the output voltage Vout is increased and remains within the supply voltage range.

When the comparator 20 signals that the output voltage Vout equals or is less than the threshold low voltage Vtl, the switches 26 and 30 are opened, the switch 22 remains open, then the switches 24 and 30 are closed so as to appropriately charge the charge dump capacitor Cd. The dump capacitor charges to reference voltage −Vr and the charge −Vr*Cd is dumped to the negative terminal of the operational amplifier 14, which causes a positive voltage adjustment +Vj in the output voltage Vout. The amount of voltage gain +Vj is determined according to the reference voltage Vr and the capacitances of the charge dump capacitor Cd and the integrating feedback capacitor Ci. Specifically, voltage gain +Vj=Vr(Cd/Ci).

After the third output voltage adjustment at time t4, the switches 24 and 28 are opened, the switch 22 remains open, and the switches 26 and 30 are closed so that the charge dump capacitor Cd discharges. As time increases, t>t4, the output voltage Vout increases until it again reaches the threshold high voltage Vth at time t5 and the output voltage downward adjustment, −Vj, is again triggered and initiated.

After the fourth output voltage adjustment at time t5, the switches 22 and 28 are opened, the switch 24 remains open, and the switches 26 and 30 are closed so that the charge dump capacitor Cd discharges. As time increases, t>t5, the output voltage Vout increases until the end of the integration period at time T.

It is understood that the circuitry used to generate the output voltage adjustments +Vj and −Vj is but one example and that other circuit configurations can be used to achieve the same output voltage adjustments.

The logic/counter 32 maintains a running count Cn of the number of output voltage adjustments made during an integration period. In the case of a voltage adjustment drop, −Vj, when the output voltage Vout reaches the threshold high voltage Vth, the count increases by one, +1. In the case of a voltage adjustment gain, +Vj, when the output voltage Vout reaches the threshold low voltage Vtl, the count decreases by one, −1. As applied to the timing diagram of FIG. 15, the count at time T is equal to +2 due to three voltage drops, +3, and one voltage gain, −1.

To determine the actual integrated output voltage over the integration period T, the output voltage Vout at time T is added to the product of the current count Cn and the voltage adjustment Vj. As applied to the timing diagram of FIG. 15, the actual integrated output voltage equals the current output voltage Vout+2Vj, since the count Cn corresponding to the timing diagram of FIG. 15 is +2. The actual integrated output voltage over the integration period T is also referred to as the reconstructed output voltage.

Figure 16:
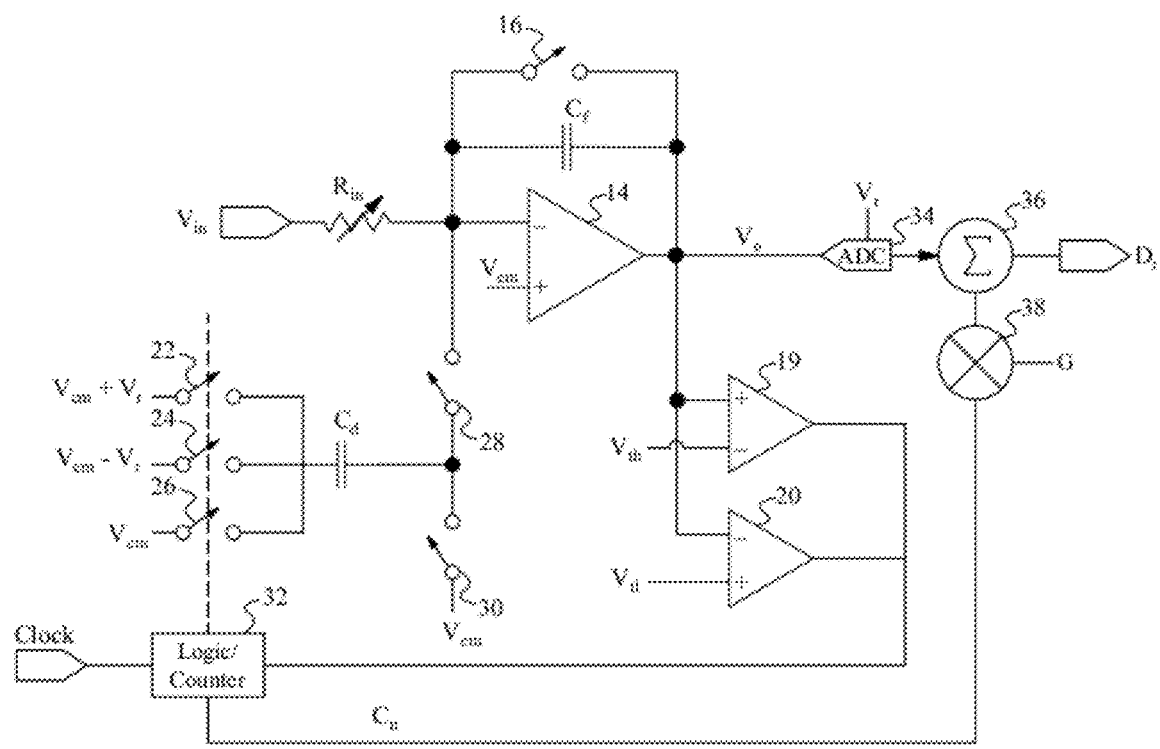
FIG. 16 illustrates a circuit for implementing the mixed signal correlator of FIG. 9 according to an embodiment.

FIG. 16 illustrates a circuit for implementing the mixed signal correlator of FIG. 9 according to an embodiment. An ADC 34 is coupled to receive the output voltage Vout. The ADC 34 also inputs a reference voltage Vr. A digital output of the ADC 34 is coupled to a summing circuit 36. A multiplier 38 is coupled to the logic/counter 32 to receive the count Cn, where the count Cn is the count at time T, the end of the integration period. The multiplier 38 also receives as input a constant G, where G is a digital representation of the voltage adjustment Vj. The multiplier 38 outputs the product Cn*G to the summing circuit 36, where the converted digital output voltage is added to the product Cn*G. The output Dr of the summing circuit 36 is the digital representation of the reconstructed output voltage. The output Dr is a weighted sum of an analog integrator output and a digital counter output.

Using the output voltage adjustment technique of the mixed signal correlator, the output voltage Vout is maintained within the range bounded by the threshold high voltage Vth and the threshold low voltage Vtl, and the actual integrated output voltage over the integration period can be reconstructed as if the limit of the supply voltage did not exist. Using the output voltage adjustment technique of the mixed signal correlator also enables the use of a smaller capacitor for capacitance measuring, which results in greater sensitivity. This technique is also independent of the integration period, so the integration period can be set as long or as short as necessary. In this manner, the integration time is decoupled from the size of the capacitor. The maximum integration time can be increased by adding bits to the counter 32. Additional counter bits also increases the final resolution of the final output.

In an alternative embodiment, the comparator functions performed by the mixed signal correlator are performed in software. For example, the comparators 19 and 20 can be replaced by software, operating for example in the control/logic block 32, where the software compares the instantaneous output voltage Vout to high and low threshold values stored in memory.

The relationship of the input voltage Vin to the output voltage Vout, as well as the value of the constant G, is determined according to the ratio of the two capacitors Cd/Ci. This ratio is very stable, essentially constant. However, some applications may require a more accurate value. Additionally, the actual capacitances may be different than their stated values. In other words, some applications may require measured, more accurate determination of the constant G. Such a determination can be achieved using a calibration process for the mixed signal correlator.

Figure 17:
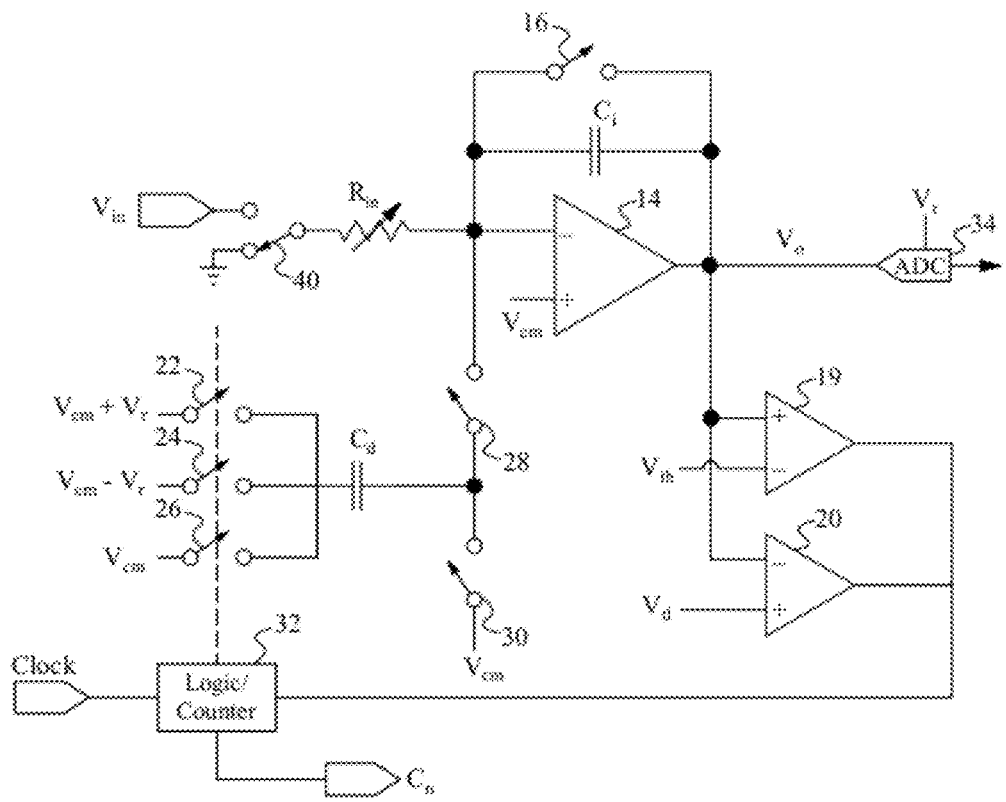
FIG. 17 illustrates a simplified schematic block diagram of a mixed signal correlator configured to perform a calibration process according to an embodiment.

FIG. 17 illustrates a simplified schematic block diagram of a mixed signal correlator configured to perform a calibration process according to an embodiment. The mixed signal correlator shown in FIG. 17 is the mixed signal correlator of FIG. 14 including the ADC 34 of FIG. 16 as well as a switch 40. Normal operation of the mixed signal correlator, such as the operation described in relation to FIGS. 14-16, is performed by connecting the switch 40 to the input voltage Vin. To calibrate the system, two steps are performed. In a first step, the integrating feedback capacitor Ci is discharged, and the input is then shorted to ground by connecting the switch 40 to ground while the voltage adjustment circuit is disabled, such as by opening switch 28. The output voltage Vout is integrated over the integration period T, digitized by the ADC 34, and output from the ADC 34 as digital output D0. The integrating feedback capacitor Ci is then discharged. In a second step, the input is again shorted to ground, and the logic/counter 32 forces one voltage adjustment, even though neither comparator 19 or 20 signaled to do so. The forced voltage adjustment is achieved by appropriately switching the switches 22-30 to generate either a voltage adjustment drop −Vj or a voltage adjustment step +Vj. The output voltage Vout is integrated over the integration period T, digitized by the ADC 34, and output from the ADC 34 as digital output D1.

Figure 18:
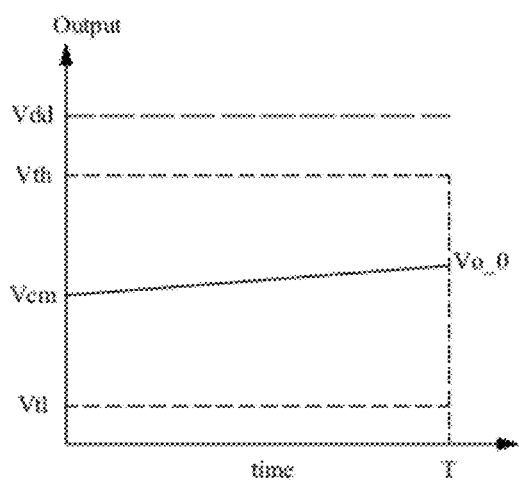
FIG. 18 illustrates a voltage output Vout versus time curve for the first step of the calibration process.
Figure 19:
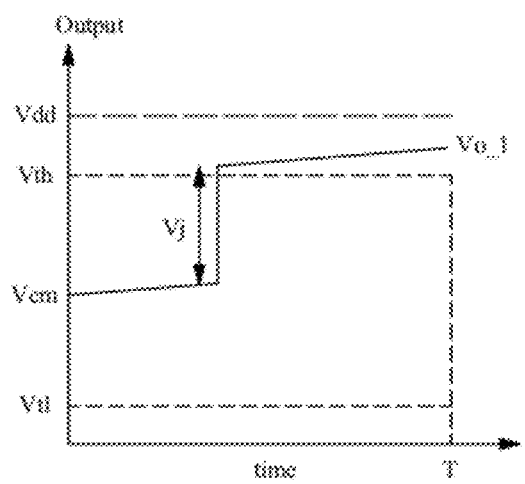
FIG. 19 illustrates a voltage output Vout versus time curve for the second step of the calibration process.

FIG. 18 illustrates a voltage output Vout versus time curve for the first step of the calibration process, where the digital output D0 is determined. The non-horizontal output voltage curve in FIG. 18 indicates extraneous voltages, such as offset and leakage voltages, present at the output when the input voltage is shorted to ground. FIG. 19 illustrates a voltage output Vout versus time curve for the second step of the calibration process, where the digital output D1 is determined. During the second step of calibration, the voltage output Vout may exceed the threshold voltage, as shown in FIG. 19. Exceeding the threshold voltage is acceptable in this case as long as the voltage output Vout does not reach the supply voltage Vdd. Subtracting the digital output D0 from the digital output D1 results in the constant G, which is the digital representation of the adjustment voltage Vj. In this manner, the value of constant G is an actual measured value, it is not an estimated value based on the stated specifications of the capacitors Cd and Ci.

The calibration process enables the circuit to determine the value of the constant G. The calibration process can be run one time or periodically. Periodic calibration enables compensation for capacitance changes over time, due to for example temperature effects or aging. The calibration process does not require additional hardware other than a switch to short the input voltage. The mixed signal correlator itself is used to perform the calibration. The calibration process also enables relaxation of the Cd to Ci capacitor matching requirements needed to achieve a desired adjustment voltage value, and reduces if not eliminates the negative impact of mismatched capacitors.

The mixed signal correlator described above includes a single counter for maintaining a running count of both positive and negative voltage adjustments. Alternatively, separate counters can be used, a first counter to count the positive voltage adjustments and a second counter to count the negative voltage adjustments. In this implementation, a first calibration can be performed to determine a first constant G1 corresponding to positive adjustment voltages +Vj, and a second calibration can be performed to determine a second constant G2 corresponding to negative adjustment voltages −Vj. The actual integrated output voltage can be determined by subtracting the actual integrated output voltage corresponding to positive voltage adjustments, using the first constant G1, and the actual integrated output voltage corresponding to the negative voltage adjustments, using the second constant G2.

The present application has been described in terms of specific embodiments incorporating details to facilitate the understanding of the principles of construction and operation of the mixed signal correlator. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:
1. An integration circuit comprising:
   a. an input control switch configured to switch to a first position coupled to an input voltage signal and to a second position coupled to ground;
   b. an integrator coupled to an output of the input control switch, wherein the integrator is configured to output an integrated output voltage,
   wherein the integrator comprises:
      a resistive element coupled to the output of the input control switch;
      an amplifier coupled to an output of the resistive element; and
      an integrating feedback capacitor coupled to an input of the amplifier and to an output of the amplifier;
   c. a voltage adjustment circuit coupled to the integrator and comprising a charge dump capacitor, wherein the volt- age adjustment circuit is configured to adjust the integrated output voltage by a voltage adjustment,
wherein the value of the voltage adjustment is set by a capacitance ratio of the charge dump capacitor and the integrating feedback capacitor; and
d. a logic circuit coupled to the voltage adjustment circuit and to the input control switch, wherein the logic circuit is configured to control the voltage adjustment circuit and the input control switch, further wherein when the input control switch is set to the first position the integrator integrates the input voltage signal and the voltage adjustment circuit adjusts the integrated output voltage by the voltage adjustment if the integrated output voltage reaches one or more defined limits, and when the input control switch is set to the second position the integrator, the voltage adjustment circuit, and the logic circuit are configured to perform a calibration process that measures a value of the adjustment value.

2. The integration circuit of claim 1 wherein the voltage adjustment circuit further comprises a plurality of switches, wherein the charge dump capacitor is coupled to the integrating feedback capacitor via a first switch of the plurality of switches, and the plurality of switches are coupled to the logic circuit.

3. The integration circuit of claim 1 further comprising an analog-to-digital converter coupled to the output of the integrator to convert the integrated output voltage to a digital value at each integration time period.

4. The integration circuit of claim 3 wherein the logic circuit is configured to perform the calibration process by measuring the digital value output from the analog-to-digital converter while the input control switch is in the second position, forcing the voltage adjustment circuit to adjust the integrated output voltage by the voltage adjustment while the input control switch is in the second position, and measuring the digital value output from the analog-to-digital converter after the forced voltage adjustment while the switch is in the second position.

5. The integration circuit of claim 1 wherein the voltage adjustment value is a fixed value Vj.

6. The integration circuit of claim 1 further comprising a comparison circuit coupled to the integrator, wherein the comparison circuit is configured to receive the integrated output voltage, to compare the integrated output voltage to the one or more defined limits, and to output a comparison result to the logic circuit.

7. The integration circuit of claim 1 wherein the logic circuit includes program instructions configured to perform the steps of comparing the integrated output voltage to the one or more defined limits, and to control the voltage adjustment circuit according to a comparison result.

8. The integration circuit of claim 1 wherein the resistive element has a fixed impedance.

9. The integration circuit of claim 1 wherein the resistive element has a time-varying impedance.

10. A method of calibrating an integration circuit, the method comprising:
a. coupling an input of an integrator to ground, the integrator comprising:
  a resistive element;
  an amplifier coupled to an output of the resistive element; and
  an integrating feedback capacitor coupled to an input of the amplifier and to an output of the amplifier;
b. discharging the integrating feedback capacitor within the integrator, wherein an output of the integrating feedback capacitor outputs an integrated output voltage according to a current charge accumulated by the integrating feedback capacitor;
c. measuring the integrated output voltage to determine a first calibration voltage;
d. applying a charge dump to the integrating feedback capacitor thereby adjusting the integrated output voltage by a voltage adjustment set based on a capacitance ratio of the integrating feedback capacitor and a charge dump capacitor;
e. measuring the integrated output voltage after application of the charge dump to determine a second calibration voltage;
f. calculating a difference between the first calibration voltage and the second calibration voltage to determine a measured adjustment voltage value that corresponds to the charge dump; and
g. discharging the integrating feedback capacitor.

11. The method of claim 10 wherein calculating the difference between the first calibration voltage and the second calibration voltage comprises converting the first calibration voltage to a first digital value, converting the second calibration voltage to a second digital value, and calculating a difference between the first digital value and the second digital value.

12. The method of claim 10 further comprising:
a. coupling the input of the integrator to receive an input voltage signal;
b. comparing the integrated output voltage to one or more threshold values to determine if the integrated output voltage is within a voltage range;
c. adjusting the charge on the integrating feedback capacitor by applying the charge dump if the integrated output voltage is not within the voltage range, thereby maintaining the integrated output voltage within the voltage range;
d. determining an accumulated voltage change corresponding to a number of adjustments in charge applied within an integrating period multiplied by the measured adjustment voltage value; and
e. determining a total integration voltage over the integrating period by adding the accumulated voltage change to the integrated output voltage at the end of the integrating period.

13. The method of claim 12 wherein adjusting the charge comprises decreasing the charge on the integrating feedback capacitor if the integrated output voltage is greater than or equal to a high threshold value, and increasing the charge on the integrating feedback capacitor if the integrated output voltage is less than or equal to a low threshold voltage, wherein decreasing the charge on the integrating feedback capacitor decreases the integrated output voltage and increasing the charge on the integrating feedback capacitor increases the integrated output voltage.

14. The method of claim 12 wherein comparing the integrated output voltage to one or more threshold values is performed in software.

15. The method of claim 12 wherein comparing the integrated output voltage to one or more threshold values is performed using one or more comparators.

16. The method of claim 12 wherein adjusting the charge on the integrating feedback capacitor results in adjusting the integrated output voltage.

17. The method of claim 12 wherein determining the total integration voltage comprises converting the integrated output voltage to a digital value at each integration time period and adding the accumulated voltage change to the digital value.

18. The method of claim 10 wherein the measured adjustment voltage value comprises a fixed value.

* * * * *

UNITED STATES PATENT AND TRADEMARK OFFICE
CERTIFICATE OF CORRECTION

PATENT NO. : 8,659,343 B2
APPLICATION NO. : 13/404817
DATED : February 25, 2014
INVENTOR(S) : Ozan E. Erdogan Page 1 of 1

It is certified that error appears in the above-identified patent and that said Letters Patent is hereby corrected as shown below:

In the Specifications:

Column 8, Line 66     Delete "sin(cot)." and insert --sin($\omega$t).--

Column 9, Line 1     After "a", delete "5"

Column 12, Line 60     Delete "an" and insert --and--

Signed and Sealed this
Twenty-ninth Day of July, 2014

Michelle K. Lee
*Deputy Director of the United States Patent and Trademark Office*